United States Patent [19]

Abe et al.

[11] Patent Number: 5,136,542
[45] Date of Patent: Aug. 4, 1992

[54] SEMICONDUCTOR MEMORY DEVICE

[75] Inventors: Sumako Abe, Tokyo; Makoto Segawa, Yokohama, both of Japan

[73] Assignee: Kabushiki Kaishi Toshiba, Kawasaki, Japan

[21] Appl. No.: 599,637

[22] Filed: Oct. 18, 1990

[30] Foreign Application Priority Data

Oct. 19, 1989 [JP] Japan ................................. 1-272637

[51] Int. Cl.[5] .............................................. G11C 13/00
[52] U.S. Cl. ........................... 365/189.05; 365/189.01; 365/206
[58] Field of Search ...................... 365/189.04, 189.05, 365/189.01, 206

[56] References Cited

U.S. PATENT DOCUMENTS

5,060,196 10/1991 Pae et al. ......................... 365/189.05

Primary Examiner—Terrell W. Fears
Attorney, Agent, or Firm—Foley & Lardner

[57] ABSTRACT

A semiconductor memory device having an internal circuit which is powered from a first power source terminal and outputs an output drive signal corresponding to a stored data in a selected memory cell of a memory cell array; and output buffer unit which is powered from a second power source terminal and operates in such a manner that a gate is closed or opened in accordance with whether the output drive signal is low level or high level, and an output signal of low level or high level corresponding to closed gate or opened gate is outputted via an external output terminal to the external; and a level change suppressing circuit for suppressing a level change of the output drive signal as viewed from the output buffer, by connecting the output terminal of the internal circuit to one of the second power source terminal and the external output terminal, when the potential at the second power source terminal changes relatively with respect to the potential at the first power source terminal as the output signal at the external output terminal changes its level between low level and high level.

14 Claims, 6 Drawing Sheets

SEMICONDUCTOR MEMORY DEVICE

FIELD OF THE INVENTION

The present invention relates to a semiconductor memory device, and more particularly to a semiconductor memory device suitable for as a semiconductor MOS memory with circuits powered by different power sources, respectively.

BACKGROUND OF THE INVENTION

Figure 1:
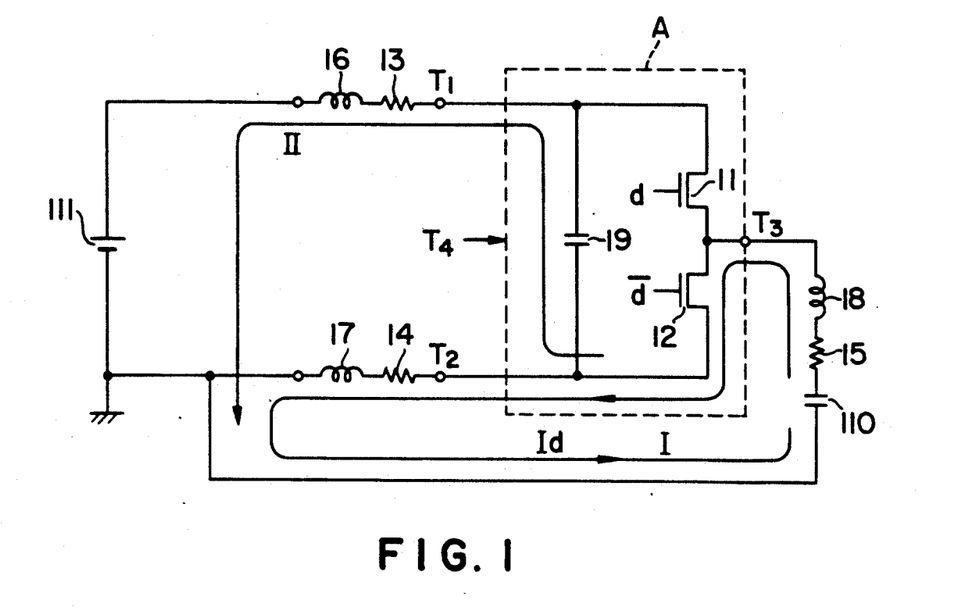
FIG. 1 is a circuit diagram showing a first conventional semiconductor memory device and explaining the operation when a "0" level is outputted.

FIG. 1 is a circuit diagram of a semiconductor device according to the background art, particularly of a data output circuit portion of a MOS memory on a semiconductor chip which has a set of power source terminals to supply a power source voltage and a ground voltage to the MOS memory. In FIG. 1, the circuit portion enclosed by a broken line indicates an internal circuit A implemented on semiconductor chip. The power source voltage is applied across the power source terminals T1 and T2. An address of a memory is supplied to an address input terminal T4. Data is outputted from a data output terminal T3. The level "1"(high) or "0" (low) of an output data at the data output terminal T3 is determined by the level "1" or "0" of an output data drive signal d or $\bar{d}$ supplied to the gates of output transistors (e.g., N-channel transistors) implemented on the semiconductor chip. Namely, when the output data drive signal d of "1" level is applied to the transistor 11, this transistor 11 becomes conductive and outputs a data of level "1". On the other hand, when the output data drive signal $\bar{d}$ of "1" level is applied to the transistor 12, this transistor 12 becomes conductive and outputs a data of level "0".

There are various parasitic elements outside of the semiconductor chip, such as those derived from the package, external wirings and the like. Specifically, on the side of the power source voltage terminal T1, there are an integrated circuit external parasitic resistor 13 and an integrated circuit external parasitic inductor. On the side of the ground voltage terminal T2, there are an integrated circuit external parasitic resistor 14 and an integrated circuit external parasitic inductor 17. In addition to such parasitic elements, on the side of the data output terminal T3, there are an integrated circuit external parasitic inductor 18, an integrated circuit parasitic resistor 15, and a load capacitor 110. Within the semiconductor chip, there is an integrated circuit internal inter-terminal capacitor 19 between the power source voltage terminal T1 and the ground voltage terminal T2. A d.c. power source 111 is connected across the power source voltage terminal T1 and ground voltage terminal T2 for supplying power therebetween.

With the circuit arrangement described above, there will be described the case where the output level at the data output terminal T3 changes from "1" to "0". In this case, the level of the output data drive signal $\bar{d}$ changes from "low" to "high" to make the output transistor 12 conductive. When this transistor 12 becomes conductive, electric charge in the load capacitor 110 is discharged through a path I routing from the data output terminal T3 to the output transistor 12. This discharge current Id flows through the parasitic resistors 14 and 15 and parasitic inductors 17 and 18 at the path I so that noise is generated on the ground voltage terminal T2. Current also flows through a path II via the capacitor 19 so that this current also generates noise on the power source voltage terminal T1.

Figure 2:
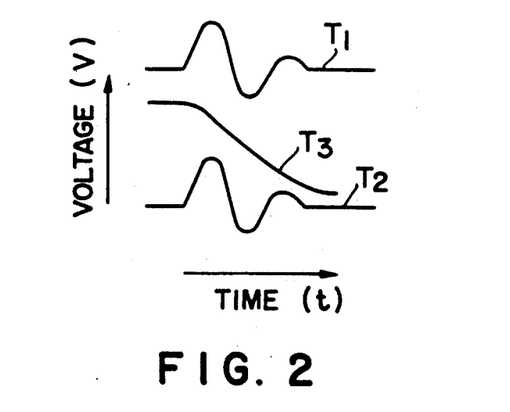
FIG. 2 shows waveforms of the circuit shown in FIG. 1 when a "0" level is outputted.

The change of voltage waveforms, during such operation, at the power source voltage terminal T1, ground voltage terminal T2, and data output terminal T3 is shown in FIG. 2. As seen from FIG. 2, as the level at the data output terminal T3 changes from "1" to "0", noise is generated on the terminals T1 and T2.

Figure 3:
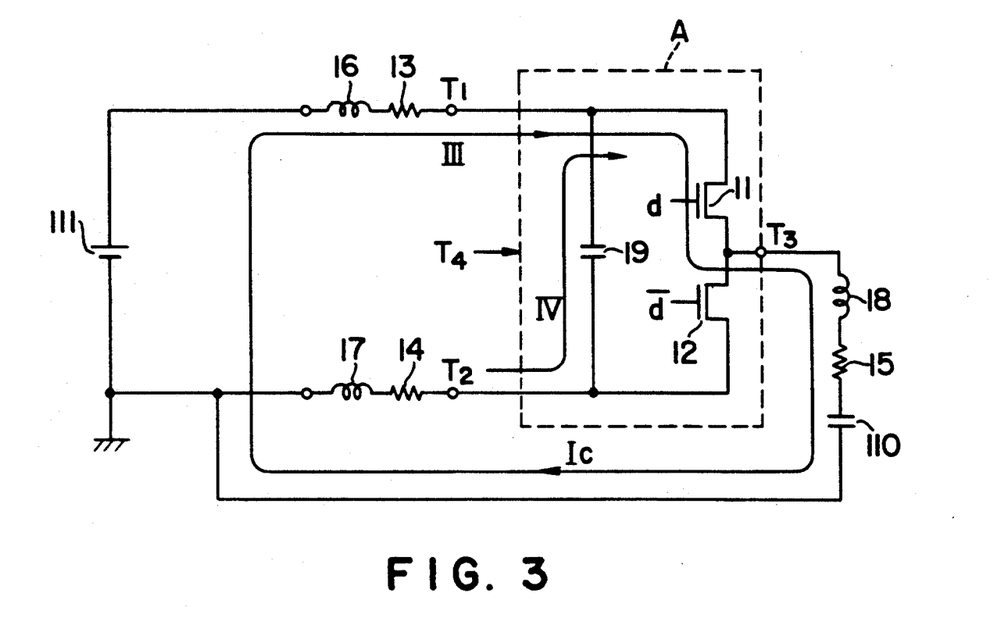
FIG. 3 is a circuit diagram showing the first conventional semiconductor memory device and explaining the operation when a "1" level is outputted.

Next, there will be described the case where the output level at the data output terminal T3 changes from "0" to "1". In this case, the level of the output data drive signal d changes from "low" to "high" to make the output transistor 11 conductive. When this transistor 11 becomes conductive, electric charge in the load capacitor 110 is charged through a path III routing via the output transistor 11 to the data output terminal T3, as shown in FIG. 3. This charge current Ic flows through the parasitic resistors 13 and 15 and parasitic inductors 16 and 18 at the path III so that noise is generated on the power source voltage terminal T1. Current also flows through a path VI via the capacitor 19 within the semiconductor chip so that this current also generates noise on the ground voltage terminal T2.

Figure 4:
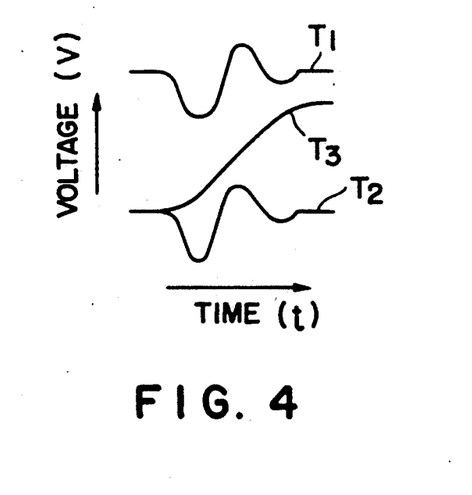
FIG. 4 shows waveforms of the circuit shown in FIG. 3 when a "1" level is outputted.

The change of voltage waveforms, during such operation, at the power source voltage terminal T1, ground voltage terminal T2, and data output terminal T3 is shown in FIG. 4. As seen from FIG. 4, as the level at the data output terminal T3 changes from "0" to "1", noise is generated on the terminals T1 and T2.

As described above, when the level at the data output terminal T3 changes from "0" to "1" or from "1" to "0", charge or discharge current flows to or from the load capacitor 110 so that noise is generated on the power source voltage terminal T1 and ground voltage terminal T3. These noises are particularly noticeable when the levels of all of a plurality of output data terminals of a semiconductor memory chip change from "0" to "1" or from "1" to "0" at the same time. Noise generated at the power source voltage terminal T1 and ground voltage terminal T3 results in noise at the address input terminal T4. Thus, an address is recognized erroneously, resulting in erroneous operation and data output delay.

As a method of solving the above problems, there is known a semiconductor device wherein power is supplied from different power source terminals to an output buffer unit and the other internal circuit of a semiconductor chip.

Figure 5:
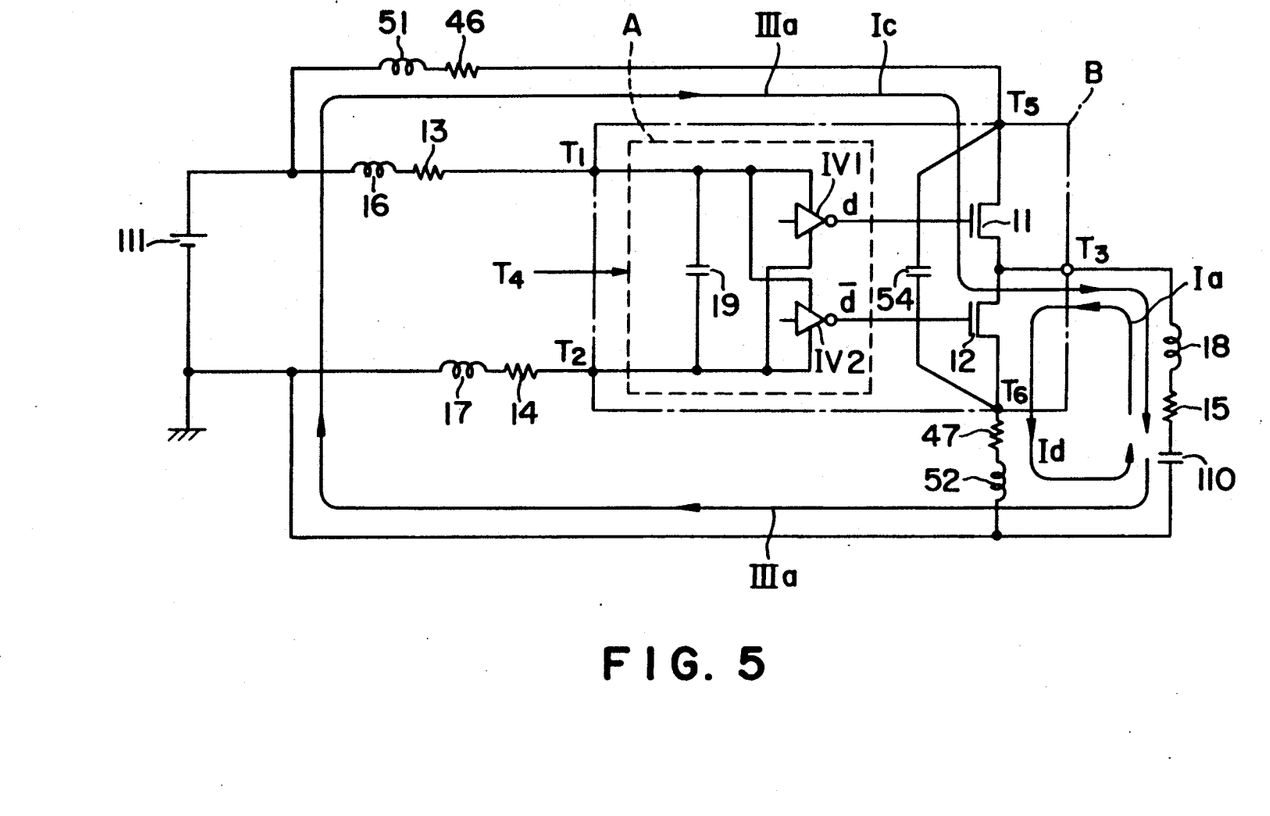
FIG. 5 is a circuit diagram showing a second conventional semiconductor memory device.

FIG. 5 is a block diagram of a circuit of such a semiconductor device. As shown in FIG. 5, there are provided, within the semiconductor chip 8 enclosed by a one-dot-chain line, a power source voltage terminal T1 and a ground voltage terminal T2 as well as an output buffer transistor $V_{DD}$ terminal T5 and $V_{SS}$ terminal T6. Output transistors 11 and 12 are independently powered from the $V_{DD}$ terminal T5 and $V_{SS}$ terminal T6. An internal circuit enclosed by a broken line is powered from the terminals T1 and T2.

In the internal circuit A, an inverter buffer IV1 outputs an output data drive signal d and an inverter buffer IV2 outputs an output data drive signal $\bar{d}$, in response to an address data from an address terminal T4. An integrated circuit inner inter-terminal capacitor 54 is present as a parasitic capacitor between the $V_{DD}$ terminal T5 and $V_{SS}$ terminal T6. There are also present an integrated circuit external parasitic inductor 51 and parasitic resistor 46 between the $V_{DD}$ terminal T5 and a d.c. power source 111. There are also present an integrated circuit external parasitic resistor 47 and parasitic inductor 52 between the $V_{SS}$ terminal and the d.c. power source 111. In FIG. 5, like elements to those shown in FIGS. 1 and 3 are represented by using identical reference numerals.

With the semiconductor device constructed as above, a change of an output data level at the data output terminal T3 from "1" to "0" occurs when the output transistor 12 becomes conductive upon reception of the output data drive signal $\bar{d}$. In this case, discharge current Id from the load capacitor 110 flows through a path Ia routing from the data output terminal T3 to the output transistor 12 and to the $V_{SS}$ terminal $V_{SS}$ T6. However, this current Id does not flow to the terminals T1 and T2. Therefore, noise will not be generated on the terminals T1 and T2.

On the other hand, a change of the output level at the data output terminal T3 from "0" to "1" occurs when the output transistor 11 turned on upon receipt of the output data drive signal d. In this case, charge current Ic to the load capacitor 110 flows through a path IIIa routing from the $V_{DD}$ terminal T5 to the output transistor 11 and to the data output terminal T3. However, this charge current does not flow to the terminals T1 and T2. Therefore, noise will not be generated on the terminals T1 and T2.

With the circuit arrangement shown in FIG. 5, it is therefore possible to prevent noise from appearing at the address input terminal T4 from which an address signal is supplied to the internal circuit A.

With the integrated circuit semiconductor device constructed as shown in FIG. 5, for example, if data of "1" level is being outputted from the data output terminal T3, the output transistor 11 is in a conductive state. As the output transistor 11 becomes conductive, current flows through the path IIIa so that noise appears at the $V_{DD}$ terminal T5. The potential at the $V_{DD}$ terminal T5 therefore lowers so that current flows through the capacitor 54 resulting in similar noise at the $V_{SS}$ terminal T6. The potential at the terminal T6 therefore lowers. In this case, there is the possibility that the actual low level of the output data drive signal $\bar{d}$ becomes high level as viewed from the $V_{SS}$ terminal, resulting in an erroneous conducting in the output transistor 12. Such erroneous operation may cause a delay of the output data at the data output terminal T3 or an erroneous output data.

SUMMARY OF THE INVENTION

The present invention has been made in consideration of the above problems and aims at providing a semiconductor memory device capable of reliably avoiding erroneous operation when an output signal level changes.

The semiconductor memory device of this invention is constructed of:

an internal circuit which is powered from a first power source terminal and outputs an output drive signal corresponding to a stored data;

an output buffer unit which is powered from a second power source terminal and operates in such a manner that a gate is closed or opened in accordance with whether the output drive signal is low level or high level, and an output signal of low level or high level corresponding to closed gate or opened gate is outputted via an external output terminal to the external; and level change suppressing means for suppressing a level change of the output drive signal as viewed from the output buffer unit, by connecting the output terminal of the internal circuit to one of the second power source terminal and the external output terminal, when the potential at the second power source terminal changes relatively with respect to the potential at the first power source terminal as the output signal at the external output terminal changes its level between low level and high level.

DESCRIPTION OF THE PREFERRED EMBODIMENTS

The embodiments of this invention will be described with reference to the accompanying drawings.

Figure 6:
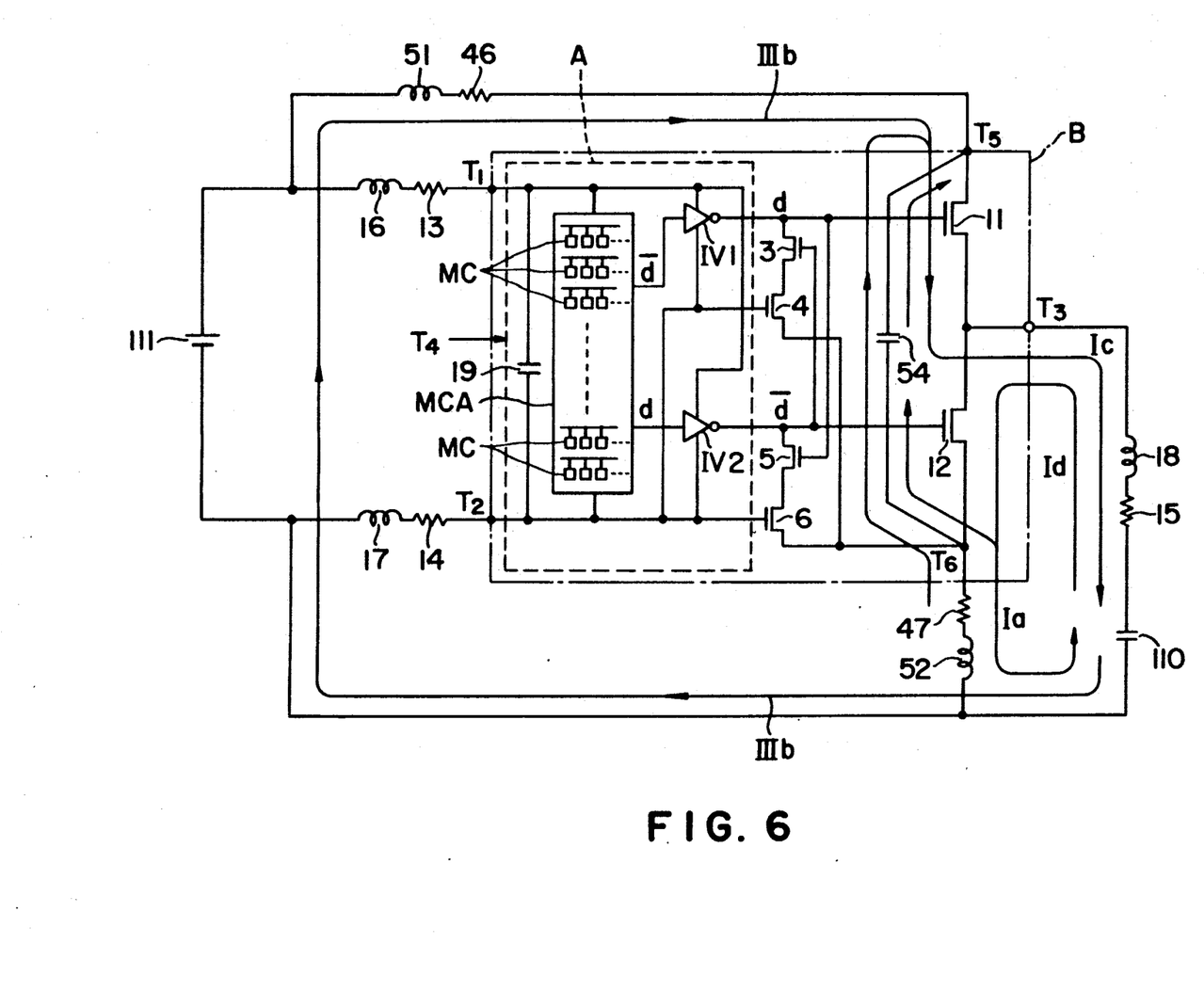
FIGS. 6 to 8 are circuit diagrams of semiconductor memory devices according to different embodiments of this invention.

FIG. 6 is a circuit diagram showing the first embodiment of this invention. In FIG. 6 like elements to those shown in FIG. 5 are represented by using identical reference numerals. The internal circuit A has a memory cell array MCA with much memory cells MC which can store 1 or 0 data. A selected memory cell MC according to address signal outputs stored data as complementary data d and $\bar{d}$ to apply to the invertors IV1 and IV2. As shown in FIG. 6, the output terminal of an inverter buffer IV1 is connected to a $V_{SS}$ terminal T6 via N-channel transistors 3 and 4, and to the gate of an N-channel transistor 5. The output terminal of an inverter buffer IV2 is connected to the $V_{SS}$ terminal T6 via N-channel transistors 5 and 6, and to the gate of an N-channel transistor 3. The gates of the N-channel transistors 4 and 6 are connected to the ground voltage terminal T2. The other circuit structure is the same as FIG. 5.

The operation of the semiconductor device constructed as above will be described below.

First, in the case of the output level change from "0" to "1" at the data output terminal T3, the level of the output data drive signal d from the inverter buffer IV1 changes from "low" to "high", whereas the level of the output data drive signal $\bar{d}$ from the inverter buffer IV2 changes from "high" to "low". As a result, the output transistor 11 becomes conductive, and the output transistor 12 becomes non-conductive. Thus, a charge current Ic flows into the load capacitor 110 via a path IIIb routing from the $V_{DD}$ terminal T5 to the output transistor 11 and to the data output terminal T3. In this case, the charge current Ic generates noise at the $V_{DD}$ terminal T5 because of the parasitic resistors 15 and 46 and parasitic inductors 18 and 51 at the path IIIb, and in addition noise appears at the $V_{SS}$ terminal T6 via the capacitor 54.

In such a condition, as described previously, the output data drive signal d is in a high level state, and the output data drive signal $\bar{d}$ is in a low level state. Accordingly, the transistor 5 becomes conductive, and the transistors 3, 4, and 6 become non-conductive.

Assuming that the potentials at the $V_{DD}$ terminal T5 and $V_{SS}$ terminal T6 become lower because of noise, the potentials at the ground voltage terminal T2 and output data drive signal $\bar{d}$ become relatively higher as viewed from the $V_{SS}$ terminal T6. If the relative potential rise at the terminal T2 exceeds the threshold voltage of the N-channel transistor 6, this transistor 6 becomes conductive. As a result, the electric charge of the output data drive signal $\bar{d}$ underwent a relative potential rise is discharged to the $V_{SS}$ terminal T6 via the N-channel transistors 5 and 6, lowering the potential of the output data drive signal $\bar{d}$. Therefore, the potential at the output data drive signal $\bar{d}$ as viewed from the $V_{SS}$ terminal will not rise in excess of the threshold value of the N-channel transistor 6. If the threshold value of the transistor 6 is preset to lower than that of the output transistor 12, it becomes possible to prevent disorder such as erroneous conduction of the output transistor 12.

Even if the potentials at the terminals T5 and T6 rise because of noise in the case of the output level change from "0" to "1", the transistor 12 is also maintained in an off-state, thereby posing no problem.

Next, in the case of the output level change from "1" to "0" at the data output terminal T3, the level of the output data drive signal changes from "high" to "low", whereas the level of the output data drive signal $\bar{d}$ changes from "low" to "high". As a result, the output transistor 11 turns off, the output transistor 12 turns on, the transistor 3 turns on, and the transistors 4 to 6 turns off. Thus, a discharge current Id from the load capacitor 110 flows through the path Ia routing from the data output terminal T3 to the output transistor 12 and to the $V_{SS}$ terminal T6. Noise is generated at the $V_{SS}$ terminal T6 and $V_{DD}$ terminal T5. If this noise causes the potential of the ground voltage terminal T2 as viewed from the $V_{SS}$ terminal T6 to exceed the threshold value of the N-channel transistor 4, this N-channel transistor 4 becomes conductive. Therefore, the electric charge of the output data drive signal d is discharged to the $V_{SS}$ terminal T6 via the N-channel transistors 3 and 4. Consequently the output data drive signal d is maintained low level so that the output transistor 11 is maintained non-conductive. In other words, if the threshold value of the discharge transistor 4 is preset to lower than that of the output transistor 11, it becomes possible to prevent disorder such as erroneous conduction in the output transistor 11. Even if the potentials at the terminals T5 and T6 rise because of noise in case the output level changes from "1" to "0", the transistor 11 is also maintained in the off thereby posing no problem.

Figure 7:
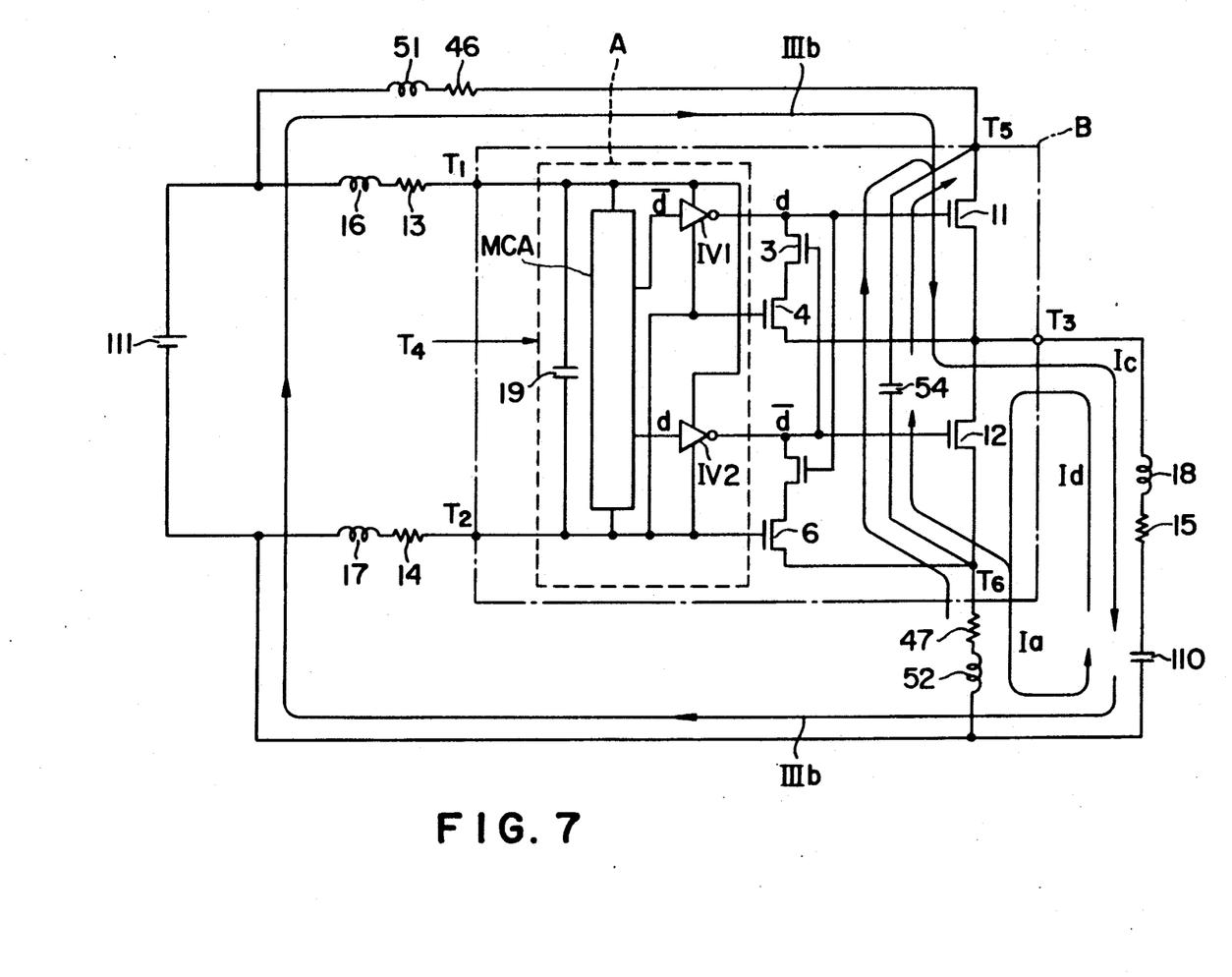

FIG. 7 is a circuit diagram showing the second embodiment of this invention. In FIG. 7, like elements to those shown in FIG. 6 are represented by using identical reference numerals. The difference between the embodiments shown in FIGS. 6 and 7 resides in that one end of the transistor 4 is not connected to the terminal T6 but to the data output terminal T3. The other structure is the same as that shown in FIG. 6.

In FIG. 7, the same operation as that of FIG. 6 is performed for the case where the output level at the data output terminal T3 changes from "0" to "1".

In the case of the output level change from "1" to "0" at the data output terminal T3, the output data drive signal changes from "high" level to "low" level, whereas the output data drive signal $\bar{d}$ changes from "low" level to "high" level. As a result, the output transistor 11 turns off, the output transistor 12 turns on, the transistor 3 turns on, and the transistors 4 to 6 turn off. The discharge current Id from the load capacitor 110 causes noise to be generated at the $V_{SS}$ terminal T6 and $V_{DD}$ terminal T5. If this noise causes the potential of the terminal T3 to lower so that potential of the ground voltage terminal T2 rises as viewed from the output level "0" at the output terminal T3 and exceeds the threshold value of the transistor 4, then this transistor 4 turns on and the electric charge at the output terminal (d) of the inverter buffer IV1 is discharged to the terminal T3 via the transistors 3 and 4. Thus, the output terminal (d) of the inverter buffer IV1 is maintained low level so that the transistor 11 maintains its off-state. In other words, if the threshold value of the transistor 4 is preset to lower than that of the output transistor 11, it becomes possible to prevent the transistor 11 from erroneously turning on while outputting a "0" data. Even if the potential at the terminal T3 rises because of noise, the off-state of the transistor 11 is also maintained, thereby posing no problem.

Figure 8:
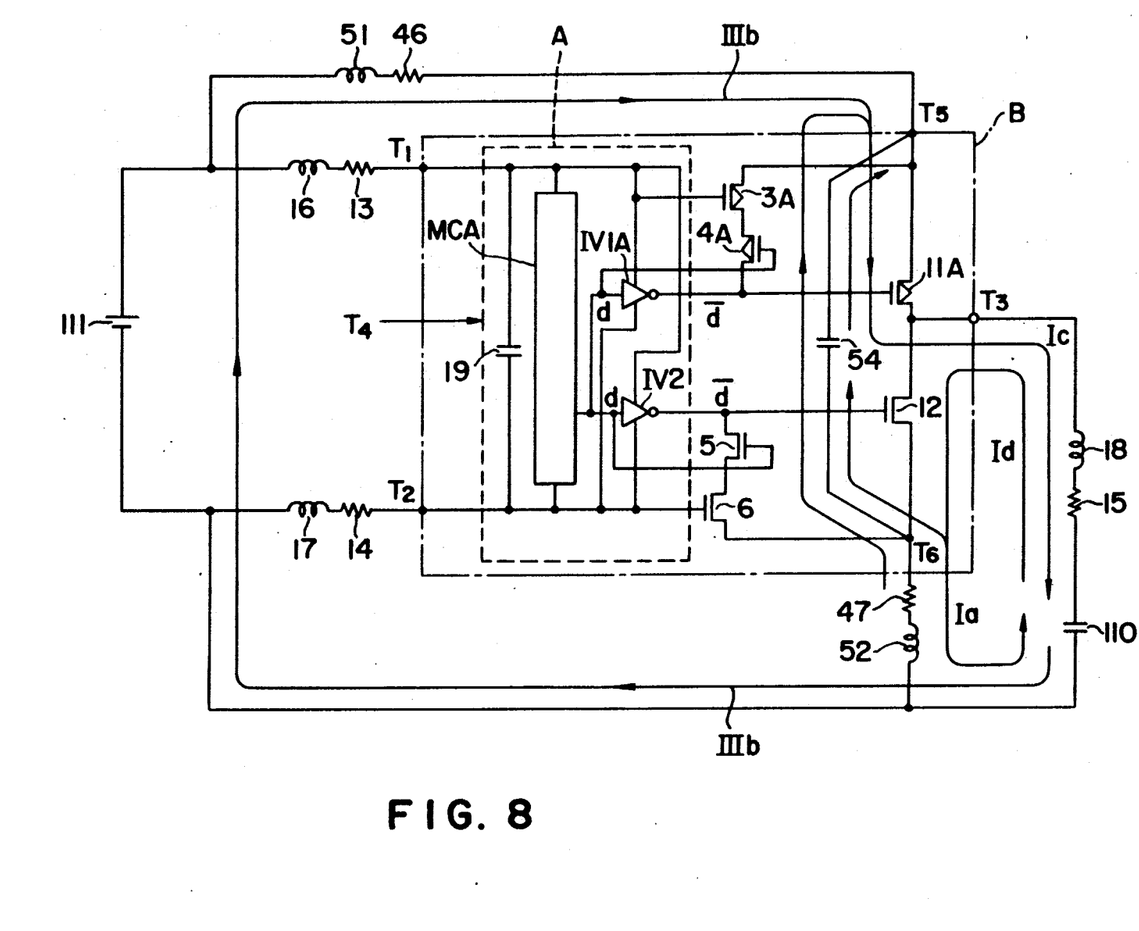

FIG. 8 is a circuit diagram showing the third embodiment of this invention. The difference between the embodiments shown in FIGS. 6 and 8 is as follows. The output buffer section or unit is constructed of a serially connected P-channel output transistor 11A and N-channel output transistor 12. Both inverter buffers IV1A and IV2 output an output data drive signal $\bar{d}$ of the same level. P-channel transistors 3A and 4A are serially connected between the terminal T5 and the inverter buffer IV1A. The terminal T1 is connected to the gate of a transistor 3A. An output data drive signal d is applied to the gate of a transistor 4A. Between the inverter buffer IV2 and the terminal T6, there are connected N-channel transistors 5 and 6. The output data drive signal d is applied to the gate of the transistor 5. The terminal T2 is connected to the gate of the transistor 6. The other structure is the same as of FIG. 6.

In the case of the output level change from "1" to "0" at the output terminal T3, the input signal d to the inverter buffers IV1A and IV2 changes from "high" level to "low" level, whereas the output signal $\bar{d}$ changes from "low" level to "high" level. As a result, the transistor 11A turns off, the transistor 12 turns on, the transistor 4A turns on, and the transistor 5 turns off. The transistors 3A and 6 turn off. As the transistor 12 turns on, the discharge current Id flows from the load capacitor 110 to the path Ia so that noise is generated at the terminal T6 and are sent to the terminal T5 via the capacitor 54. Consider now that the potential at the terminal T5 rises relatively with respect to that at the terminal T1. As the potential at the terminal T1 lowers to greater than the threshold value of the transistor 3A with respect to the potential at the terminal T5, this transistor 3A turns on. Therefore, the electric charge at the terminal T5 flows as the charge current to the output side of the inverter buffer IV1A via the transistors 3A and 4A. Thus, irrespective of the generation of noise, the potential $\bar{d}$ (level "1") at the output side of the inverter buffer IV1A maintains level "1". Erroneous conduction of the transistor 11A can thus be prevented.

Even if the potential at the terminal T5 lowers because of noise in the case of the output level change from "1" to "0", the off-state of the transistor 11A is also maintained, thereby posing no problem.

Similarly, even if the potential at the terminal T6 rises because of noise in the case of the output level change at the data output terminal from "0" to "1", the off-state of the transistor 12 is also maintained, thereby posing no problem. Furthermore, even if the potential lowers, the transistor 6 turns on so that the electric charge at the output side (at the gate of the transistor 12) of the inverter buffer IV2 is discharged via the transistors 5 and 6, thereby maintaining the off-state of the transistor 12.

As appreciated from the foregoing description of the embodiments of this invention, in a semiconductor memory device having a plurality number of power source terminals for independent supply of power to the separated output buffer unit and other internal circuit, mismatching to be caused by independent power supply can be eliminated, and access delay time and erroneous operation due to noise can be avoided.

What is claimed is:

1. A semiconductor memory device comprising:
   an internal circuit which is powered from a first power source terminal and outputs an output drive signal corresponding to a stored data in a selected memory cell of a memory cell array;
   an output buffer unit which is powered from a second power source terminal and operates in such a manner that a gate is closed or opened in accordance with whether said output drive signal is at a low level or at a high level, and an output signal of said low level or said high level corresponding to the closed gate or the opened gate is outputted via an external output terminal; and
   level change suppressing means for suppressing a level change of said output drive signal as viewed from said output buffer unit, by connecting the output terminal of said internal circuit to one of said second power source terminal and said external output terminal, when the potential at said second power source terminal changes relatively with respect to the potential at said first power source terminal as said output signal at said external output terminal changes its level between said low level and said high level.

2. A semiconductor memory device according to claim 1, wherein:
   said first power source terminal includes a high voltage first power source terminal and a low voltage first power source terminal;
   said second power source terminal includes a high voltage second power source terminal and a low voltage second power source terminal;
   said output terminal of said internal circuit includes first and second output terminals, each outputting one of two signals of either a set of two output drive signals having the same level or a set of two output drive signals having complementary levels;
   said output buffer unit includes first and second switching elements serially connected between said high voltage and low voltage second power source terminals, the control terminal of said first switching element is connected to said first output terminal, the control terminal of said second switching element is connected to said second output terminal, and one of said first and second switching elements turns on and the other turns off upon reception of said output drive signals from said first and second output terminals; and
   said level change suppressing means connects one of said first and second output terminals from which an off-signal for turning off one of said first and second switching elements is outputted as said output drive signal, to one of said second power source terminal and said external output terminal to thereby maintain unchanged the level of said off-signal as viewed from said output buffer unit.

3. A semiconductor memory device according to claim 2, wherein:
   said first and second output terminals output said output drive signals having complementary levels;
   said first and second switching elements include N-channel transistors; and
   when the potential at said low voltage second power source terminal lowers relatively with respect to the potential at said lower voltage first power source terminal, said level change suppressing means connects one of said first and second output terminals which outputs a low level signal as said output drive signal, to said low voltage second power source terminal of said output buffer unit.

4. A semiconductor memory device according to claim 3, wherein said first output terminal is connected to said low voltage second power source terminal via first and second level suppressing switching elements, said second output terminal is connected to said low voltage second power source terminal via third and fourth level suppressing switching elements, the control terminal of said first level suppressing switching element is connected to said second output terminal, the control terminals of said second and fourth level suppressing switching elements are connected to said low voltage first power source terminal, and the control terminal of said third level suppressing switching element is connected to said first output terminal.

5. A semiconductor memory device according to claim 4, wherein said first to fourth level suppressing switching elements include N-channel transistors.

6. A semiconductor memory device according to claim 2, wherein:
   said first and second output terminals output said output drive signals having complementary levels;
   said first and second switching elements include N-channel transistors; and
   when the potential at said low voltage second power source terminal lowers relatively with respect to the potential at said lower voltage first power source terminal and said first output terminal outputs a low level signal as said output drive signal, said level change suppressing means connects said first output terminal to said external output terminal of said output buffer unit, and when the potential at said low voltage second power source terminal lowers relatively with respect to the potential at said lower voltage first power source terminal and said second output terminal outputs a low level as said output drive signal, said level change suppressing means connects said second output terminal to said low voltage second power source terminal of said output buffer unit.

7. A semiconductor memory device according to claim 6, wherein said first output terminal is connected to said external output terminal of said output buffer unit via first and second level suppressing switching elements, said second output terminal is connected to said low voltage second power source terminal via third and fourth level suppressing switching elements, the control terminal of said first level suppressing switching elements is connected to said second output terminal, the control terminals of said second and fourth level suppressing switching elements are connected to said low voltage first power source terminal, and the control terminal of said third level suppressing switching element is connected to said first output terminal.

8. A semiconductor memory device according to claim 7, wherein said first to fourth level suppressing switching elements include N-channel transistors.

9. A semiconductor memory device according to claim 2, wherein:
said first and second output terminals output said output drive signals having the same level;
said first switching element includes a P-channel transistor and said second switching elements are N-channel transistors; and
when the potential at said high voltage second power source terminal rises relatively with respect to the potential at said high voltage first power source terminal and said first output terminal outputs a high level signal as said output drive signal, said level change suppressing means connects said first output terminal to said high voltage second power source terminal at said output buffer unit, and when the potential at said low voltage second power source terminal lowers relatively with respect to the potential at said low voltage first power source terminal and said second output terminal outputs a low level signal as said output drive signal, said level change suppressing means connects said second output terminal to said low voltage second power source terminal at said output buffer unit.

10. A semiconductor memory device according to claim 9, wherein said internal circuit outputs said stored data, inverts said stored data with inverters and outputs inverted data from said first and second output terminals, said high voltage second power source terminal is connected to said first output terminal via first and second level suppressing switching elements, said second output terminal is connected to said low voltage second power source terminal via third and fourth level suppressing switching elements, the control terminal of said first level suppressing switching element is connected to said high voltage first power source terminal, the control terminals of said second and third level suppressing switching elements are connected to the input terminals of said inverters, and the control terminal of said fourth level suppressing switching element is connected to said low voltage first power source terminal.

11. A semiconductor memory device according to claim 10, wherein said first and second level suppressing switching elements include P-channel transistors, and said, third and fourth level suppressing switching elements include N-channel transistors.

12. A semiconductor memory device according to claim 4, wherein the threshold value of said second level suppressing element is lower than the threshold level of said first switching element, and the threshold level of said fourth level suppressing switching element is lower than the threshold level of said second switching element.

13. A semiconductor memory device according to claim 6, wherein the threshold value of said second level suppressing element is lower than the threshold level of said first switching element, and the threshold level of said fourth level suppressing switching element is lower than the threshold level of said second switching element.

14. A semiconductor memory device according to claim 9, wherein the threshold value of said first level suppressing element is lower than the threshold level of said first switching element, and the threshold level of said fourth level suppressing switching element is lower than the threshold level of said second switching element.

* * * * *